(12) United States Patent
Ho et al.

(10) Patent No.: US 7,575,970 B2
(45) Date of Patent: Aug. 18, 2009

(54) DEEP TRENCH CAPACITOR THROUGH SOI SUBSTRATE AND METHODS OF FORMING

(75) Inventors: Herbert L. Ho, New Windsor, NY (US); Kangguo Cheng, Beacon, NY (US); Yoichi Otani, Bargen BE (CH); Kevin R. Winstel, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 327 days.

(21) Appl. No.: 11/470,809

(22) Filed: Sep. 7, 2006

(65) Prior Publication Data

US 2008/0064178 A1 Mar. 13, 2008

(51) Int. Cl.
*H01L 21/8242* (2006.01)
(52) U.S. Cl. .................. 438/246; 257/E21.651
(58) Field of Classification Search ............. 438/246, 438/247, 248, 389, 390, 391; 257/E21.651
See application file for complete search history.

(56) References Cited

U.S. PATENT DOCUMENTS 6,297,088 B1 * 10/2001 King .................. 438/243
6,355,518 B1 * 3/2002 Wu et al. ................. 438/246

FOREIGN PATENT DOCUMENTS

WO WO2006055357 A2 5/2006

* cited by examiner

*Primary Examiner*—Chandra Chaudhari
(74) *Attorney, Agent, or Firm*—Todd M. C. Li; Hoffman Warnick LLC

(57) ABSTRACT

Methods of forming a deep trench capacitor through an SOI substrate, and a capacitor are disclosed. In one embodiment, a method includes forming a trench opening into the SOI substrate to the silicon substrate; depositing a sidewall spacer in the trench opening; etching to form the deep trench into the silicon substrate; forming a first electrode by implanting a dopant into the silicon substrate, whereby the sidewall spacer protects the BOX layer and the silicon layer; removing the sidewall spacer; depositing a node dielectric within the deep trench; and forming a second electrode by depositing a conductor in the deep trench. Implanting creates a substantially uniform depth doped region except at a portion adjacent to a lowermost portion of the deep trench, which may be substantially bulbous. The BOX layer is protected from undercutting by the sidewall spacer, and the implantation removes the need for out-diffusing dopant from silica glass.

16 Claims, 7 Drawing Sheets

DEEP TRENCH CAPACITOR THROUGH SOI SUBSTRATE AND METHODS OF FORMING

BACKGROUND OF THE INVENTION

1. Technical Field

The invention relates generally to semiconductor memory fabrication, and more particularly, to a deep trench capacitor through a silicon-on-insulator (SOI) substrate and methods of forming the same.

2. Background Art

Static random access memory (SRAM) is used in microprocessors built on semiconductor-on-insulator (SOI) substrates for cache memory. SOI substrates include a silicon layer on a buried insulator layer, such as a buried silicon oxide (BOX), on a silicon substrate. Embedded dynamic random access memory (eDRAM), however, is also advantageous for SOI substrates because an eDRAM cell uses approximately a fifth of the space of an SRAM cell. For example, an SRAM typically uses six transistors arranged in planar manner, while an eDRAM uses one transistor and a deep trench capacitor extending into the silicon substrate. Accordingly, eDRAM could be used to drastically reduce chip size. Alternatively, eDRAM may be used to provide up to approximately five times more memory capacity in the same amount of space.

One challenge in employing eDRAM in SOI substrate is the amount of lateral undercut into the BOX layer of the SOI substrate that occurs during the deep trench creation process. For example, in a typical eDRAM cell layout, trench-to-trench spacing is usually minimized or close to a minimum spacing. If the BOX layer undercut is large, deep trenches may actually short one another as the undercut may be filled with conductor, e.g., doped N+ polysilicon. In particular, current technology employs two hydrofluoric (HF) acid etches: one to remove a hardmask used to open the trenches, and a second to remove arsenic-doped glass (ASG) and its capping layer, e.g., tetraethyl orthosilicate, $Si(OC_2H_5)_4$ (TEOS). The ASG is used to form a buried electrode of the eDRAM by out-diffusing the arsenic into surrounding silicon, and then removing the ASG. Unfortunately, these two HF acid etches completely remove the BOX layer between deep trenches in 90 nm technology.

One approach to addressing this situation is to provide a deeper active area etch that etches silicon throughout the entire BOX layer thickness. Unfortunately, under this approach, the shallow trench isolation (STI) fill (used to electrically isolated devices on the substrate) and planarization process would need to be modified from standard practices. In particular, because the active area troughs are deeper in the eDRAM array, a thicker silicon oxide would be needed to fill the deeper STI in the eDRAM array. If the active area etch is highly selective to silicon oxide, as is common, this would result in only the silicon of the SOI substrate being etched away while the BOX layer remains relatively unperturbed in the non-eDRAM areas (e.g., logic and SRAM areas). Unfortunately, this approach creates a situation where more silicon oxide would need to be polished from the non-eDRAM areas than the eDRAM array. As a result, the planarization process would have to be adjusted to account for the greater topography.

A solution to minimize the BOX layer undercut as much as possible to allow for an easy integration path for trench e-DRAM in SOI substrates is needed.

SUMMARY OF THE INVENTION

Methods of forming a deep trench capacitor through an SOI substrate, and a capacitor are disclosed. In one embodiment, a method includes forming a trench opening into the SOI substrate to the silicon substrate; depositing a sidewall spacer in the trench opening; etching to form the deep trench into the silicon substrate; forming a first electrode by implanting a dopant into the silicon substrate, whereby the sidewall spacer protects the BOX layer and the silicon layer; removing the sidewall spacer; depositing a node dielectric within the deep trench; and forming a second electrode by depositing a conductor in the deep trench. Implanting creates a substantially uniform depth doped region except at a portion adjacent to a lowermost portion of the deep trench, which may be substantially bulbous. The BOX layer is protected from undercutting by the sidewall spacer, and the implantation removes the need for out-diffusing dopant from silica glass.

A first aspect of the invention provides a method of forming a deep trench capacitor in a silicon-on-insulator (SOI) substrate, the SOI substrate including an SOI layer on a buried silicon oxide (BOX) layer, the SOI substrate formed on a silicon substrate, the method comprising: forming a trench opening into the SOI substrate to the silicon substrate; depositing a sidewall spacer in the trench opening; etching to form the deep trench into the silicon substrate; forming a first electrode by implanting a dopant into the silicon substrate, whereby the sidewall spacer protects the BOX layer and the silicon layer; removing the sidewall spacer; depositing a node dielectric within the deep trench; and forming a second electrode by depositing a conductor in the deep trench.

A second aspect of the invention provides a deep trench capacitor comprising: a deep trench within a substrate; a first electrode including a doped region within the substrate, the doped region having a substantially uniform depth except at a portion adjacent to a lowermost portion of the deep trench; a node dielectric within the deep trench; and a second electrode including a conductor within the node dielectric.

A third aspect of the invention provides a method of forming a deep trench capacitor in a silicon-on-insulator (SOI) substrate, the SOI substrate including an SOI layer on a buried silicon oxide (BOX) layer, the SOI substrate formed on a silicon substrate, the method comprising: forming a trench opening into the SOI substrate to the silicon substrate; depositing a sidewall spacer in the trench opening; etching to form the deep trench into the silicon substrate; forming a first electrode by implanting a dopant including at least one of the following: arsenic (As) and phosphorous (P), into the silicon substrate, whereby the sidewall spacer protects the BOX layer and the silicon layer; removing the sidewall spacer; depositing a node dielectric within the deep trench; and forming a second electrode by: depositing a conductor into the deep trench, etching to recess the conductor to a depth below the silicon layer, removing the node dielectric from a side of the silicon layer, depositing the conductor into the deep trench, and etching to recess the conductor to a depth substantially equal to a surface of the silicon layer.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 5:
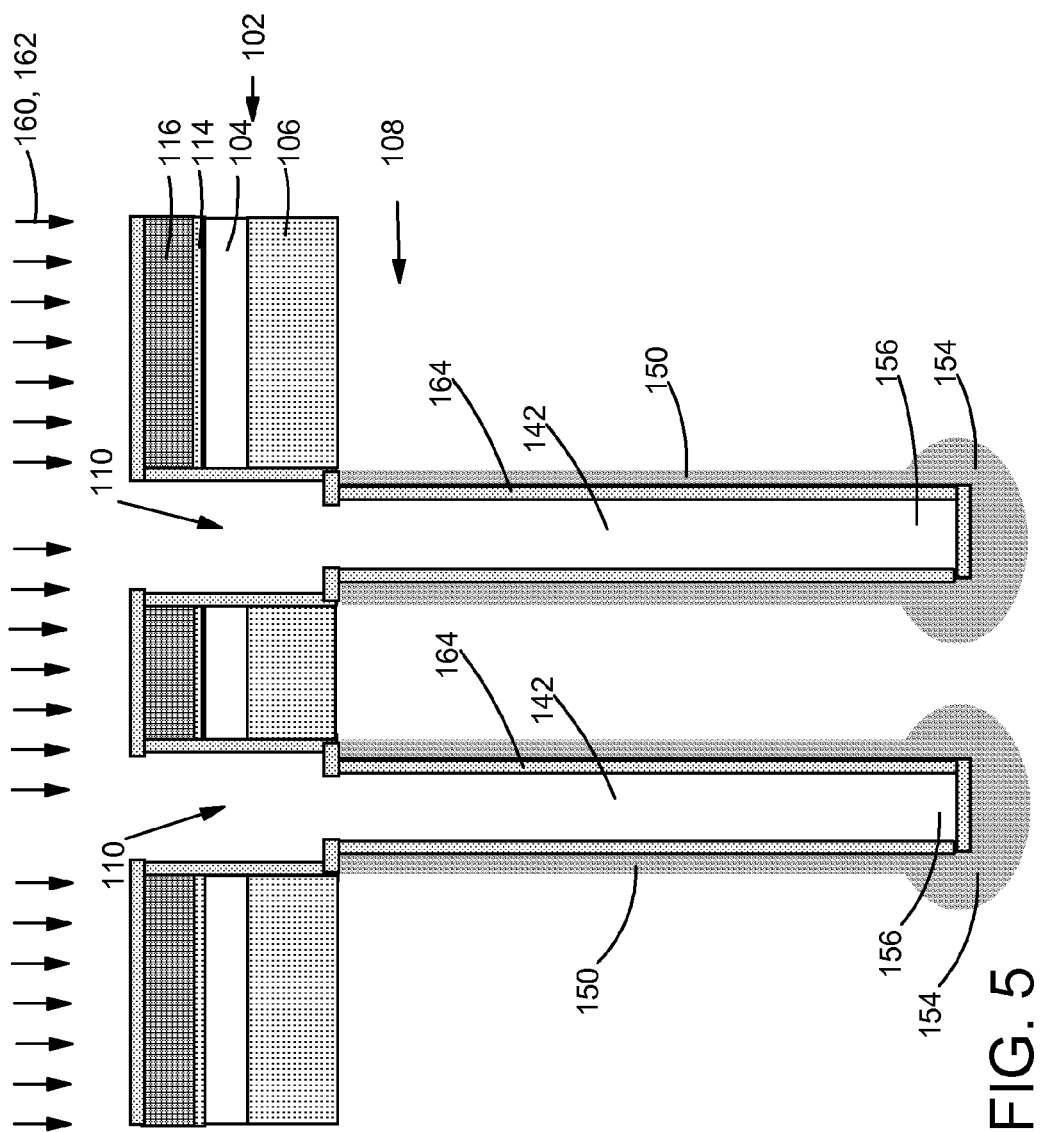
Figure 6:
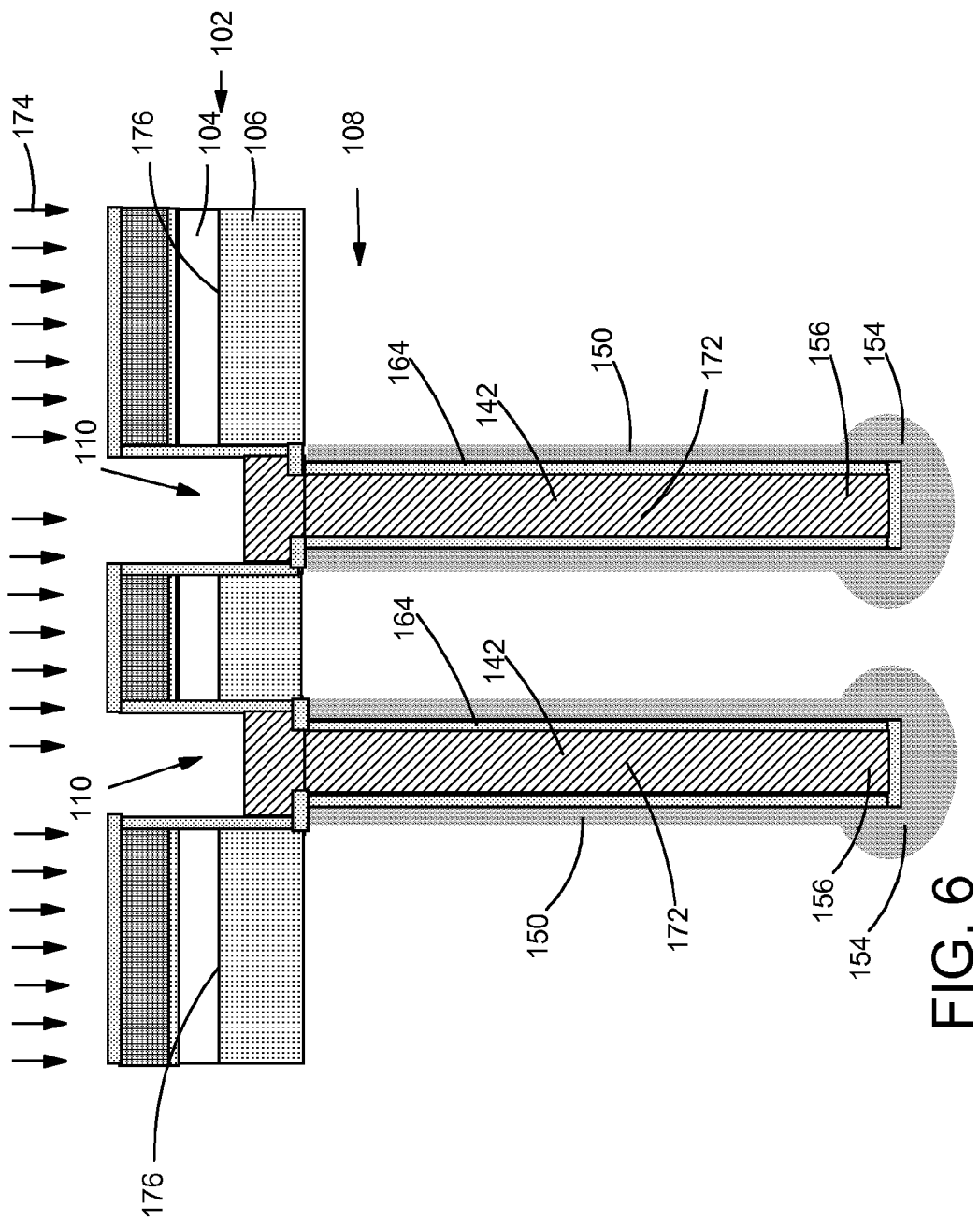
Figure 7:
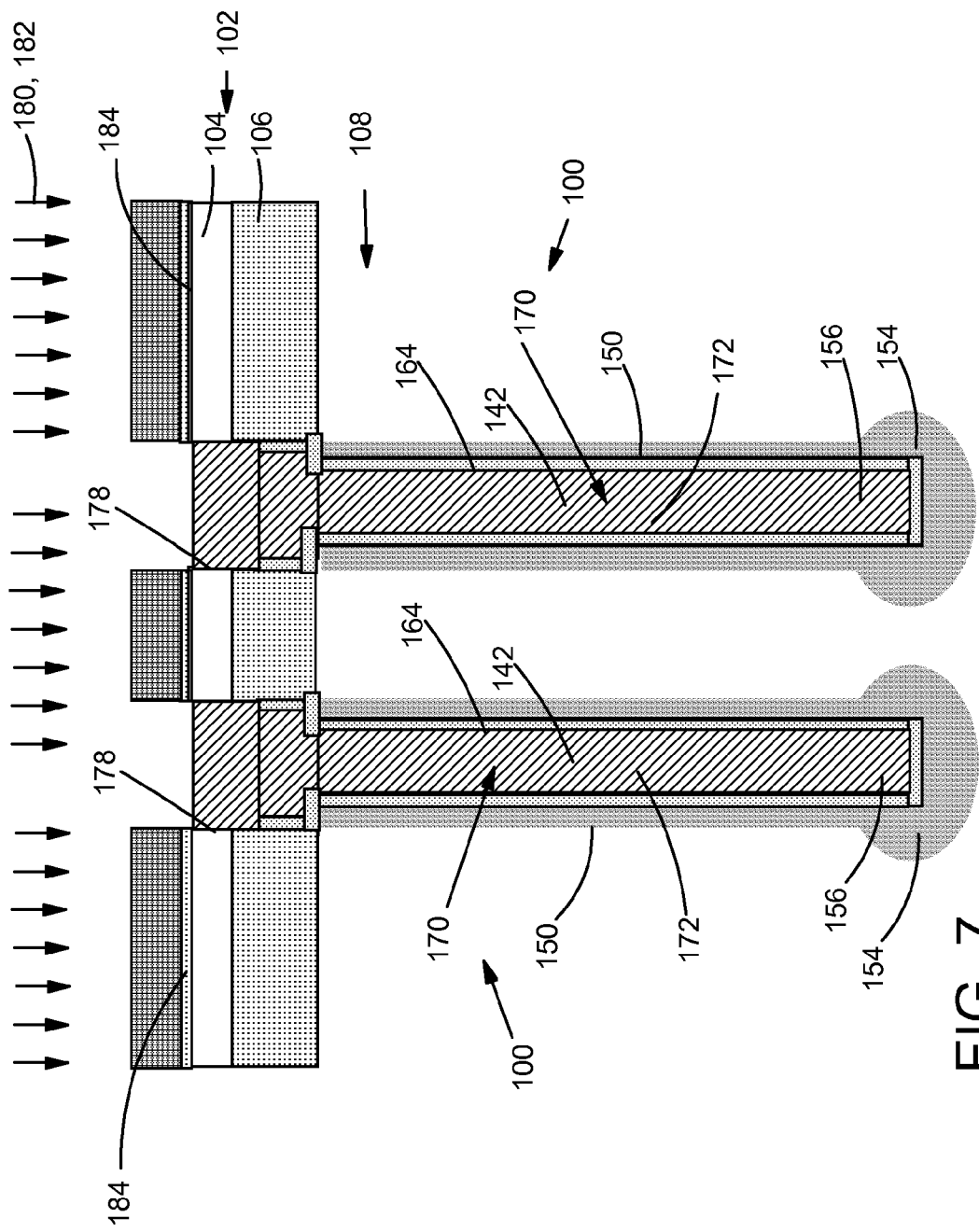

Turning to the drawings, FIGS. 1-7 illustrate one embodiment of a method of forming a deep trench capacitor 100 (FIG. 7) (hereinafter "DT capacitor 100"). As shown in FIG. 7, DT capacitor 100 is formed through a silicon-on-insulator (SOI) substrate 102 including an SOI layer 104 on a buried silicon oxide ($SiO_2$)(BOX) layer 106. SOI substrate 102 is formed on a silicon substrate 108. In one example, BOX layer 106 and silicon layer 104 may have thicknesses of approximately 1450 Angstroms (Å) and 700 Å, respectively. However, the invention is not limited to those dimensions. In the following description, two DT capacitors 100 are shown being formed; it is understood, however, that any number of DT capacitors 100 may be formed at any one time.

Figure 1:
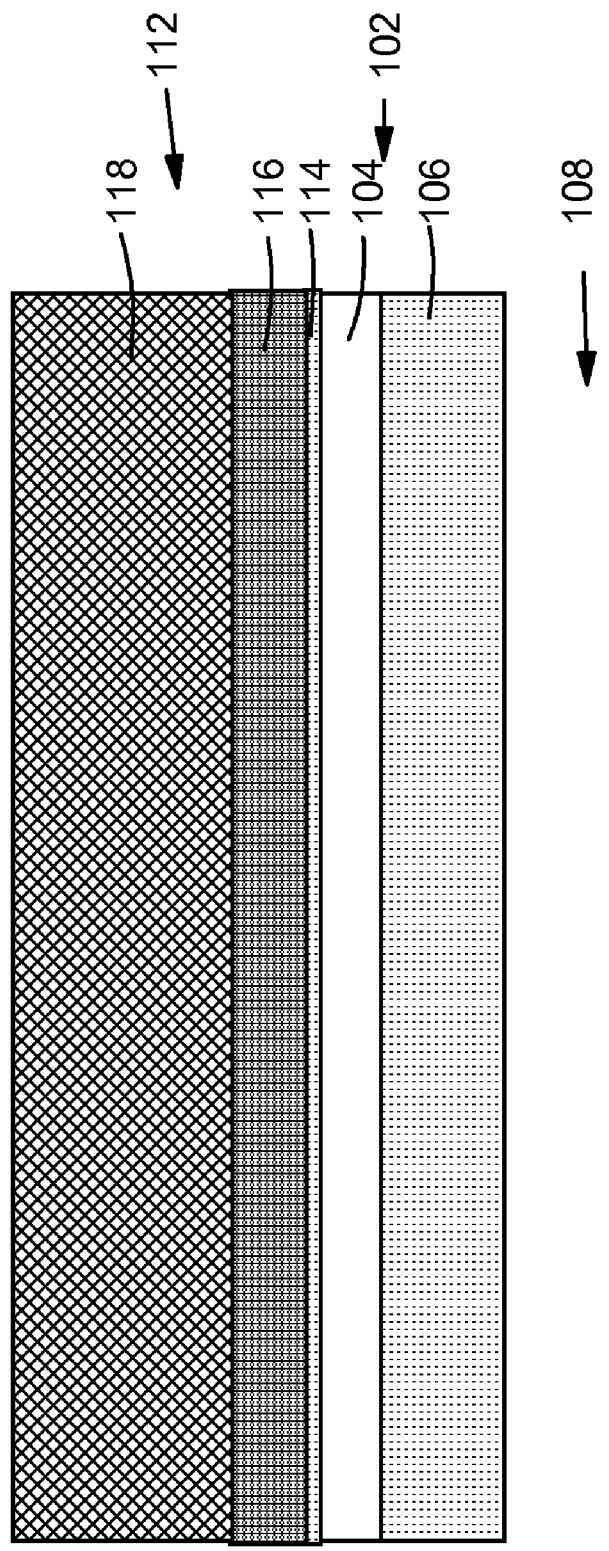
FIGS. 1-7 show one embodiment of a method of forming a deep trench capacitor, with FIG. 7 showing one embodiment of the deep trench capacitor, according to the invention.
Figure 2:
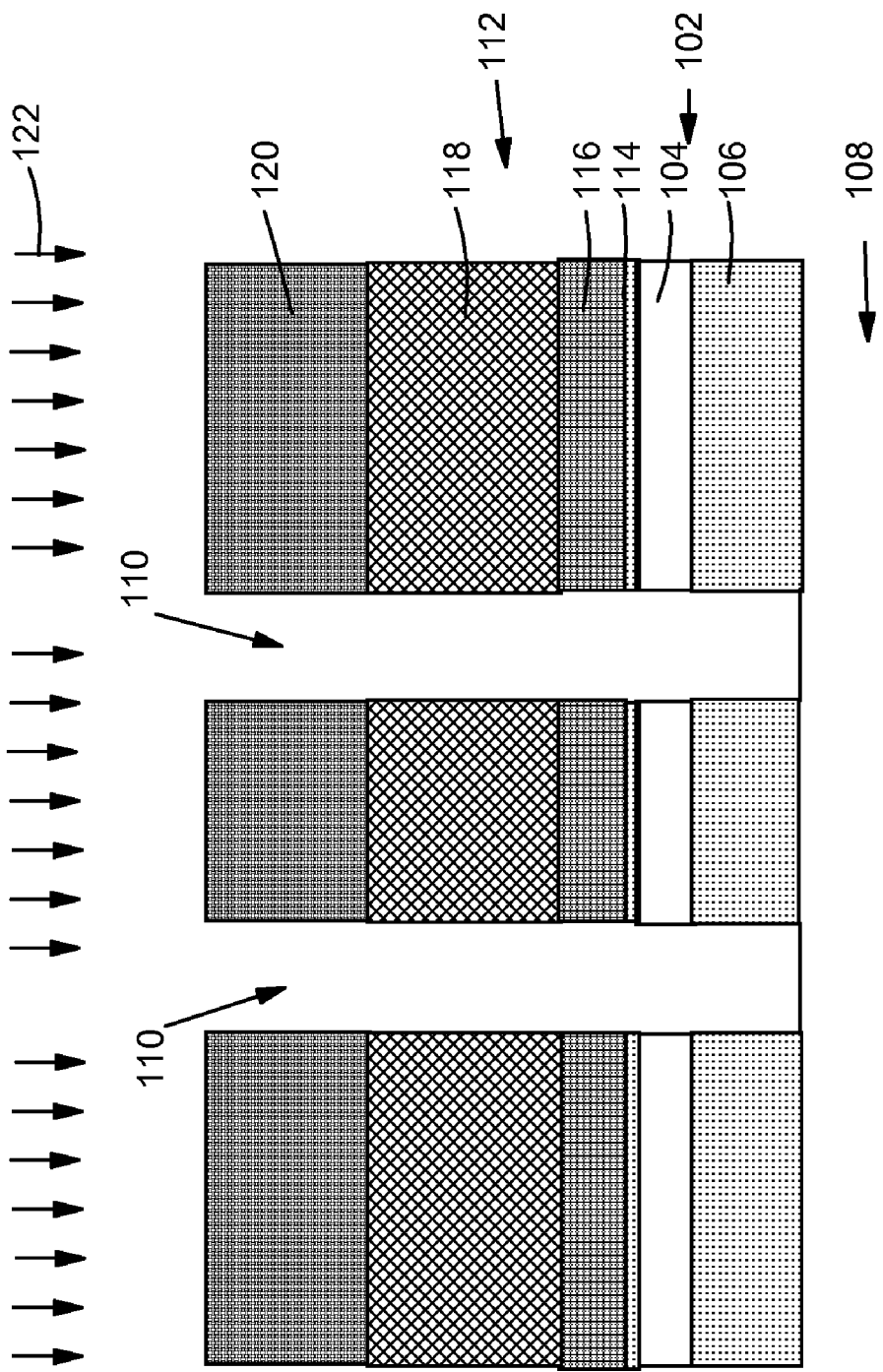

Referring to FIGS. 1-2, a trench opening 110 (FIG. 2) is formed into SOI substrate 102 to silicon substrate 108. Trench opening 110 forming may include forming a hardmask 112 on SOI substrate 102. Hardmask 112 may include, for example, a pad silicon oxide layer 114, a pad silicon nitride ($Si_3N_4$) layer 116 and a high density plasma (HDP) silicon oxide layer 118. Unless otherwise specified, each layer described herein may be deposited in any now known or later developed and appropriate manner such as chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), sputtering deposition, ion beam deposition, electron beam deposition, laser assisted deposition, spin-on methods, physical vapor deposition (PVD), atomic layer deposition (ALD). Layers 114, 116, 118 may have thicknesses that are appropriate for the expected etching processes, described herein. For example, although the invention is not limited to these dimensions, pad oxide layer 114 may have a thickness of approximately 80 Å, pad nitride layer 116 may have a thickness of approximately 1200 Å, and HDP oxide layer 118 may have a thickness of approximately 6500 Å. Trench opening 110 may have width of, for example 160 nm; however, other widths may also be employed. As shown in FIG. 2, hardmask 112 is patterned in any now known or later developed fashion, e.g., using a photoresist 120, and etching 122 to form trench opening 110. Etching 122 may include any etch capable of etching layers 118, 116, 114, 104, 106 and stopping on silicon substrate 108, e.g., a reactive ion etch (RIE). Photoresist 120 is then removed using any now known or later developed resist stripping techniques.

Figure 3:
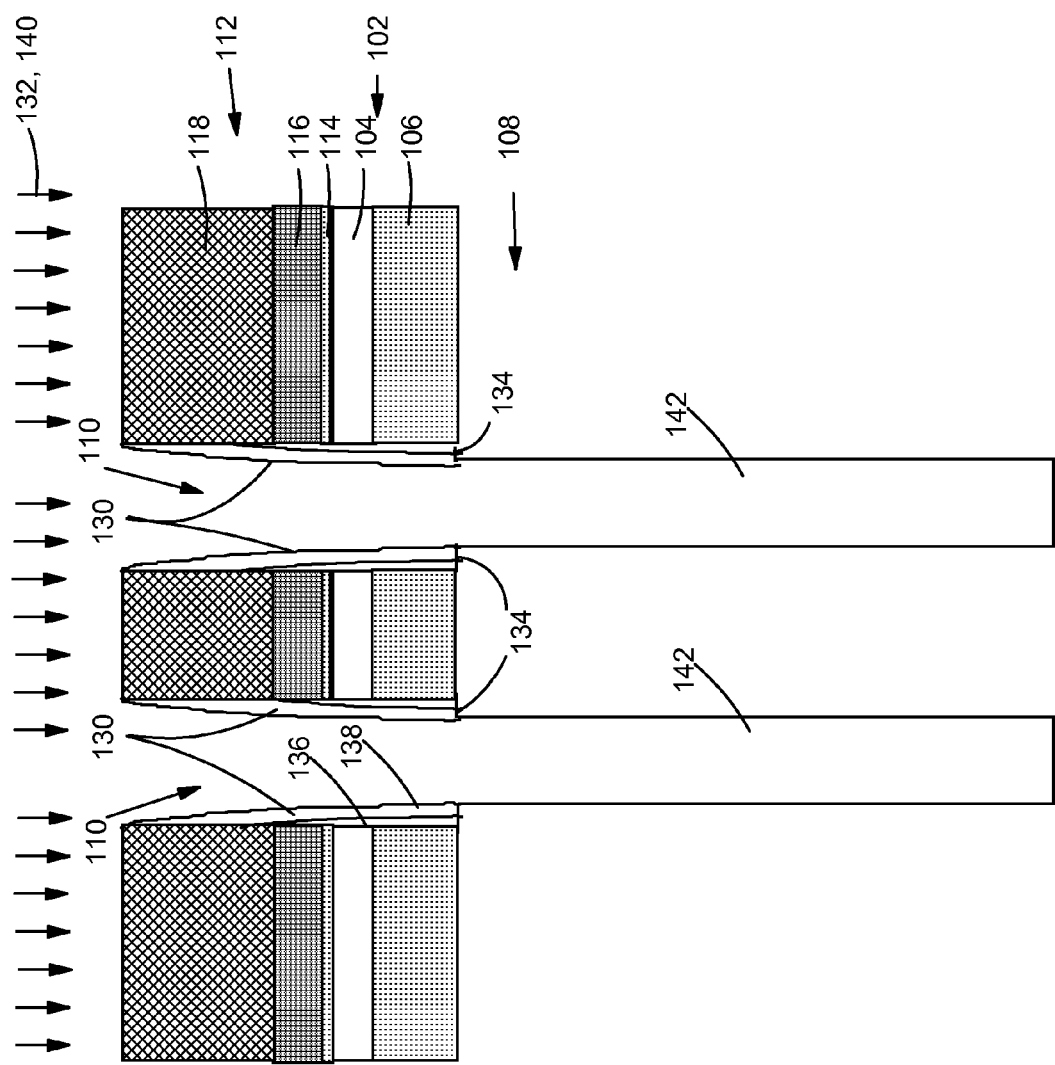

Next, as shown in FIG. 3, a sidewall spacer 130 is deposited in trench opening 110. Sidewall spacer 130 covers sidewalls of silicon layer 104 and BOX layer 106. As part of this process, an SOI substrate 102 pullback etch 132, e.g., a RIE, may be performed to create a ledge 134 for sidewall spacer 130. Sidewall spacer 130 may include sub-layers, for example, a silicon nitride layer 136 and a silicon oxide layer 138 (FIG. 3 only). In one embodiment, silicon nitride layer 136 is deposited as two layers, e.g., as a first, approximately 40 Å layer, and a second, approximately 130 Å LPCVD layer. Silicon oxide layer 138 may be high temperature oxide (HTO) having a thickness of, for example, approximately 80 Å. Other thicknesses may also be employed for layers 136, 138 within the scope of the invention.

Next, as also shown in FIG. 3, etching 140 is performed to form a deep trench 142 into silicon substrate 108, i.e., extend trench opening 110 into silicon substrate 108. Deep trench 142 may extend, for example, approximately 4.5 μm; however, other depths may be used. Etch 140 may include, for example, a RIE. Etch 140 also shapes/forms sidewall spacer 130 on sidewalls of silicon layer 104 and BOX layer 106.

Figure 4:
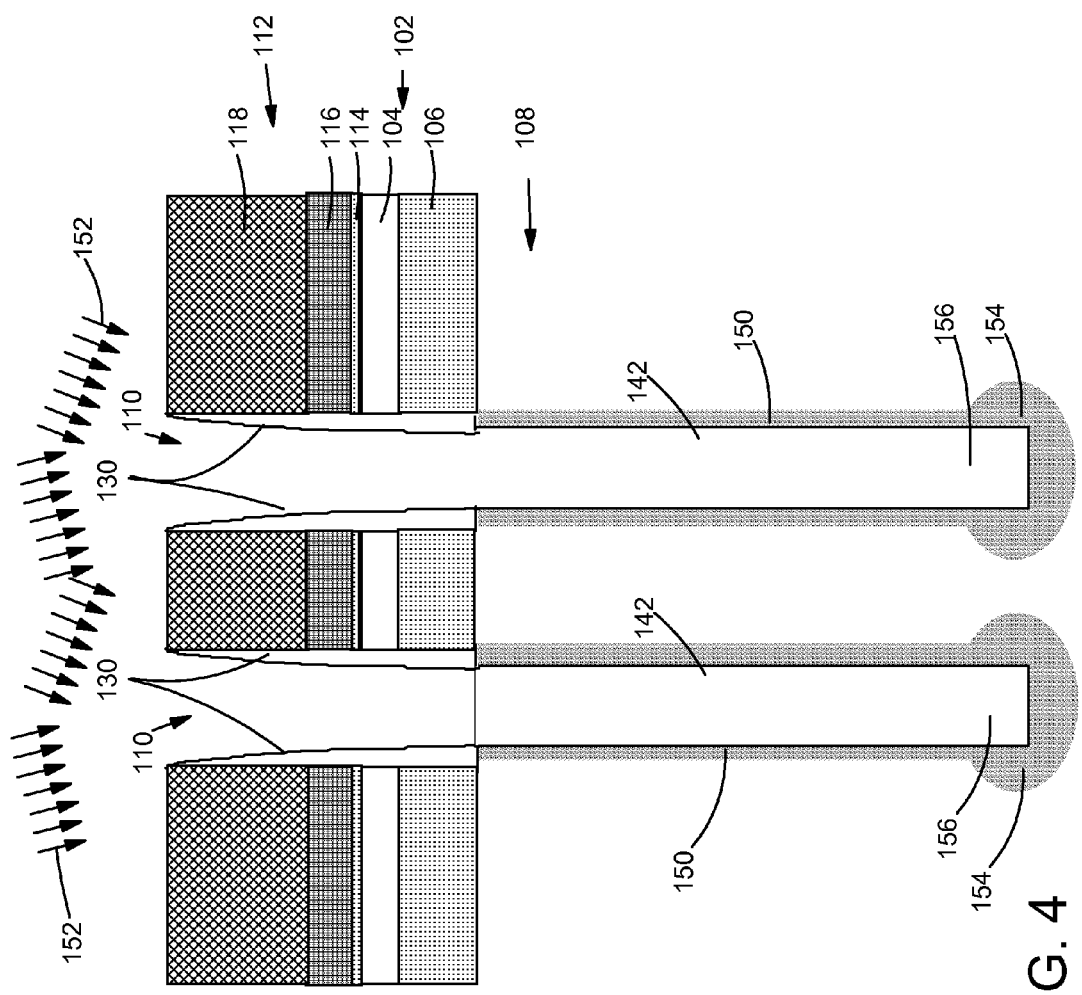

FIG. 4 shows forming a first electrode 150 by implanting 152 a dopant into silicon substrate 108. During implant 152, sidewall spacer 130 protects BOX layer 106 and silicon layer 104. Hence, silicon layer 104 is not doped. In one embodiment, the dopant may include arsenic (As) and/or phosphorous (P). It may also include any other dopant now known or later used for forming a plate electrode of a DT capacitor. Implanting 152 may have an energy of, for example, greater than approximately 20 keV and no greater than approximately 50 keV. As shown in FIG. 4, in one embodiment, implanting 152 may include implanting at an angle, e.g., of approximately 2 degrees. However, this may not be necessary. Implant 152 removes the need to deposit and out-diffuse dopant using, for example, an arsenic silica glass (ASG). Implant 152 forms a doped region (i.e., first electrode 150) within silicon substrate 108 having a substantially uniform depth except at a portion 154 adjacent to a lowermost portion 156 of deep trench 142. Portion 154 may have a substantially bulbous shape, i.e., it is substantially spherical except where deep trench 142 penetrates. Portion 154 does not exist in conventional DT capacitors that are formed using out-diffusion techniques.

FIG. 5 shows removing sidewall spacer 130 (FIG. 4). This process may include performing a hardmask silicon oxide wet etch 160 using, for example, hydrofluoric acid, to remove hardmask layer 118 (FIG. 4), and then a silicon nitride wet etch using, for example, an etchant containing hydrofluoric acid and ethylene glycol, to remove sidewall spacer 130. FIG. 5 also shows depositing a node dielectric 164 within deep trench 142. Node dielectric 164 may include any now known or later developed dielectric material used for DT capacitors such as silicon nitride or high dielectric constant materials such as hafnium oxide ($HfO_2$) or aluminum oxide ($Al_2O_3$). Node dielectric 164 may have a thickness of, for example, approximately 4.3 nm. However, the invention is not limited to that dimension.

FIGS. 6-7 show forming a second electrode 170 (FIG. 7) by depositing a conductor 172 in deep trench 142. In one embodiment, conductor 172 may include heavily (e.g., N+) doped polysilicon or amorphous silicon. However, the invention is not limited to those materials. As shown in FIG. 6, this process may include depositing conductor 172 into deep trench 142, i.e., deposit conductor 172 and planarize, and etching 174 to recess conductor 172 to a depth below BOX layer 106. With the illustrative dimensions stated above, the recess depth may be approximately 60 nm below a surface 176 of BOX layer 106. Next, as shown in FIG. 7, node dielectric 164 (e.g., silicon nitride) is removed from a side 178 of silicon layer 104, e.g., by etching 180 using an etchant containing hydrofluoric acid and ethylene glycol. Conductor 172 is then deposited again into deep trench 142, i.e., deposit conductor 172 in a top portion of deep trench 142 and planarize, and an etching 182 is performed to recess conductor 172 to a depth substantially equal to or below a surface 184 of silicon layer 104.

As shown in FIG. 7, DT capacitor 100 includes deep trench 142 within substrate 108, a first electrode 150 including a doped region within substrate 108 having a substantially uniform depth except at portion 154 adjacent to lowermost portion 156 of deep trench 142, node dielectric 164 within deep trench 142, and second electrode 170 including conductor 172 within node dielectric 164. As illustrated, portion 154 has a depth, i.e., into substrate 108, greater than the substantially uniform depth of the rest of first electrode 150, and may have a substantially bulbous shape. DT capacitor 100 extends through SOI substrate 102 over substrate 108.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method of forming a deep trench capacitor in a silicon-on-insulator (SOI) substrate, the SOI substrate including a silicon layer on a buried silicon oxide (BOX) layer, the SOI substrate formed on a silicon substrate, the method comprising:
    forming a trench opening into the SOI substrate to the silicon substrate;
    depositing a sidewall spacer in the trench opening prior to forming a deep trench;
    etching the trench opening to shape the sidewall spacer and form the deep trench into the silicon substrate;
    forming a first electrode by implanting a dopant into the silicon substrate, whereby the sidewall spacer protects the BOX layer and the silicon layer;
    removing all of the sidewall spacer from the deep trench;
    depositing a node dielectric within the deep trench; and
    forming a second electrode by depositing a conductor in the deep trench.

2. The method of claim 1, wherein the trench opening forming includes:
    forming a hardmask on the SOI substrate;
    patterning the hardmask; and
    etching to form the trench opening.

3. The method of claim 1, wherein the sidewall spacer includes a first silicon nitride layer, a second silicon nitride layer and a silicon oxide layer.

4. The method of claim 1, wherein the implanting has an energy of greater than approximately 20 keV and no greater than approximately 50 keV.

5. The method of claim 1, wherein the implanting includes implanting at an angle.

6. The method of claim 1, wherein the dopant includes at least one of the following: arsenic (As) and phosphorous (P).

7. The method of claim 1, wherein the conductor includes one of the following: heavily doped polysilicon and amorphous silicon.

8. The method of claim 1, wherein the first electrode includes a doped region within the substrate, the doped region having a substantially uniform depth except at a portion adjacent to a lowermost portion of the deep trench.

9. The method of claim 1, wherein the second electrode forming includes:
    depositing the conductor into the deep trench;
    etching to recess the conductor to a depth below the silicon layer;
    removing the node dielectric from a side of the silicon layer;
    depositing the conductor into the deep trench; and
    etching to recess the conductor to a depth substantially equal to a surface of the silicon layer.

10. A method of forming a deep trench capacitor in a silicon-on-insulator (SOI) substrate, the SOI substrate including an SOI layer on a buried silicon oxide (BOX) layer, the SOI substrate formed on a silicon substrate, the method comprising:
    forming a trench opening into the SOI substrate to the silicon substrate;
    depositing a sidewall spacer in the trench opening;
    etching to form the deep trench into the silicon substrate;
    forming a first electrode by implanting a dopant including at least one of the following: arsenic (As) and phosphorous (P), into the silicon substrate, whereby the sidewall spacer protects the BOX layer and the silicon layer;
    removing the sidewall spacer;
    depositing a node dielectric within the deep trench; and
    forming a second electrode by:
        depositing a conductor into the deep trench,
        etching to recess the conductor to a depth below the silicon layer,
        removing the node dielectric from a side of the silicon layer,
        depositing the conductor into the deep trench, and
        etching to recess the conductor to a depth substantially equal to a surface of the silicon layer.

11. The method of claim 10, wherein the trench opening forming includes:
    forming a hardmask on the SOI substrate;
    patterning the hardmask; and
    etching to form the trench opening.

12. The method of claim 10, wherein the first electrode includes a doped region within the substrate, the doped region having a substantially uniform depth except at a portion adjacent to a lowermost portion of the deep trench.

13. The method of claim 10, wherein the sidewall spacer includes a first silicon nitride layer, a second silicon nitride layer and a silicon oxide layer.

14. The method of claim 10, wherein the implanting has an energy of greater than approximately 20 keV and no greater than approximately 50 keV.

15. The method of claim 10, wherein the implanting includes implanting at an angle.

16. The method of claim 10, wherein the conductor includes one of the following: heavily doped polysilicon and amorphous silicon.

* * * * *